(12) United States Patent
Chuang

(10) Patent No.: US 6,859,086 B2
(45) Date of Patent: Feb. 22, 2005

(54) METHOD AND DEVICE FOR GENERATING SELECTION SIGNAL WITH IMPROVED ACCURACY

(75) Inventor: Ying-Lang Chuang, Taipei (TW)

(73) Assignee: Via Technologies, Inc. (TW)

(*) Notice: Subject to any disclaimer, the term of this patent is extended or adjusted under 35 U.S.C. 154(b) by 0 days.

(21) Appl. No.: 10/670,877

(22) Filed: Sep. 26, 2003

(65) Prior Publication Data
US 2004/0066224 A1 Apr. 8, 2004

(30) Foreign Application Priority Data
Oct. 2, 2002 (TW) ........................... 91122774 A

(51) Int. Cl.$^7$ ................................................ H03K 17/00
(52) U.S. Cl. .................................... 327/407; 327/99
(58) Field of Search ........................ 327/407–411, 99

(56) References Cited

U.S. PATENT DOCUMENTS 3,877,023 A * 4/1975 Spicer et al. ............... 341/118
6,108,352 A * 8/2000 Sferrazza et al. ........... 370/503

* cited by examiner

Primary Examiner—Kenneth B. Wells
(74) Attorney, Agent, or Firm—Madson & Metcalf

(57) ABSTRACT

A device and a method are used for generating a selection signal provided for a multiplexing circuit. The multiplexing circuit generates an output signal from a plurality of source signals in response to the selection signal. The device includes an operational circuit and a toggle control circuit. The method includes steps of: performing an OR operation of the plurality of source signals to obtain an operational output signal; and latching the operational output signal in an active low manner in response to a selection command to obtain the selection signal. By prohibiting the selection signal from toggling when any of the plurality of source signals is at an output-enabled state, the accuracy of the selection signal can be improved.

13 Claims, 7 Drawing Sheets

METHOD AND DEVICE FOR GENERATING SELECTION SIGNAL WITH IMPROVED ACCURACY

FIELD OF THE INVENTION

The present invention relates to a method and a device for generating a selection signal, and more particularly to a method and a device for generating a selection signal with improved accuracy.

BACKGROUND OF THE INVENTION

Many problems in microprocessor design arise with the increasing operational speed of the microprocessor. For example, the toggling action of a selection signal may adversely affect the accuracy of the output signal in response thereto. It is a big issue to be solved.

Please refer to FIG. 1A, in which a conventional 4*1 multiplexer M for outputting an output signal O from four signals P1~P4 in response to a selection signal E is illustrated. The operation of the multiplexer M is referred to FIG. 1B. The multiplexer M comprises a decoder M0, a first, a second, a third and a fourth AND gates M1~M4 and an OR gate M5. When the four signals P1~P4 are inputted to the decoder M0, four decoding signals E1~E4 corresponding thereto are generated in response to the selection signal E. The input signals P1~P4 and the decoding signals E1~E4 are operated by the AND gates M1~M4, respectively, to output only one of the four input signals P1~P4 at the same time. In order to achieve this purpose, only should one of the decoding signals E1~E4 be at an enabling state, e.g. a high-level state, at the same time, and the others should be at a disabled state, e.g. a low-level state, so as to output the one of the four signals P1~P4 corresponding to the high-level decoding signal. By changing the bit combination of the selection signal E, the bit states of the decoding signals E1~E4 are changed so as to output another one of the signals P1~P4.

Sometimes, two different ones of the four signals P1~P4 are to be outputted continuously. The selection signal E will thus involve in toggling action. The waveform of the output signal O of the multiplexer M may be influenced by the toggling action. Please refer to FIG. 2, which exemplifies the problem resulting from the toggling action. In this example, the four input signals P1~P4 are source signals derived from a high-frequency signal and generated by a phase-locked loop (PLL) circuit. There is a constant phase difference between every two adjacent ones of the source signals P1~P4. For example, the phase difference is one clock unit. Further, it is desired that the first source signal P1 is to be outputted within the period from the time point t1 to the time point t6, and the third source signal P3 is to be outputted within the period t6~t11. In other words, the selection signal E toggles at the time point t6. It is understood that the output signal O is supposed to be maintained at a high level from t1 to t11 because the first and the third source signals are continuously outputted without interruption. In practice, however, the state transition may lag to some extent. As shown in FIG. 2, it is common that while the first decoding signal E1 changes from the high-level state to the low-level state at the time point t6, the third decoding signal E3 does not change from the low-level state to the high-level state until the time point t7. Accordingly, the level of the output signal O within the period t6~t7 will be unexpectedly low. Under this circumstance, the downstream device or circuit working in response to the output signal O is subject to error function.

SUMMARY OF THE INVENTION

Therefore, it is an object of the present invention to provide a device and a method for generating a selection signal that is provided for a multiplexer to obtain an accurate output signal.

A first aspect of the present invention relates to a method for improving accuracy of a selection signal provided for a multiplexing circuit. The multiplexing circuit generates an output signal from a plurality of source signals in response to the selection signal. The method comprises a step of prohibiting the selection signal from toggling when any of the plurality of source signals is at an output-enabled state.

Preferably, the output-enabled state is a high-level state.

In one embodiment, every adjacent two of the source signals have one-clock difference therebetween, and the plurality of source signals are a series of increasingly lagging signals.

Alternatively, every adjacent two of the source signals have one-clock difference therebetween, and the plurality of source signals are a series of increasingly leading signals.

For example, the plurality of source signals are generated by a phase-locked loop (PLL) circuit in response to a high frequency signal.

A second aspect of the present invention relates to a method for generating a selection signal provided for a multiplexing circuit. The multiplexing circuit generates an output signal from a plurality of source signals in response to the selection signal. The method comprises steps of: performing an OR operation of the plurality of source signals to obtain an operational output signal; and latching the operational output signal in an active low manner in response to a selection command to obtain the selection signal.

A third aspect of the present invention relates to a device for generating a selection signal provided for a multiplexing circuit. The multiplexing circuit generates an output signal from a plurality of source signals in response to the selection signal. The device comprises: an operational circuit receiving and operating the plurality of source signals to obtain an operational output signal; and a toggle control circuit coupled to the operational circuit and latching the operational output signal under a certain state condition in response to a selection command to obtain the selection signal.

Preferably, the operational circuit is an OR gate.

Preferably, the toggle control circuit is a transparent latch.

Preferably, the certain state condition is an active low condition.

BRIEF DESCRIPTION OF THE DRAWINGS

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1A:
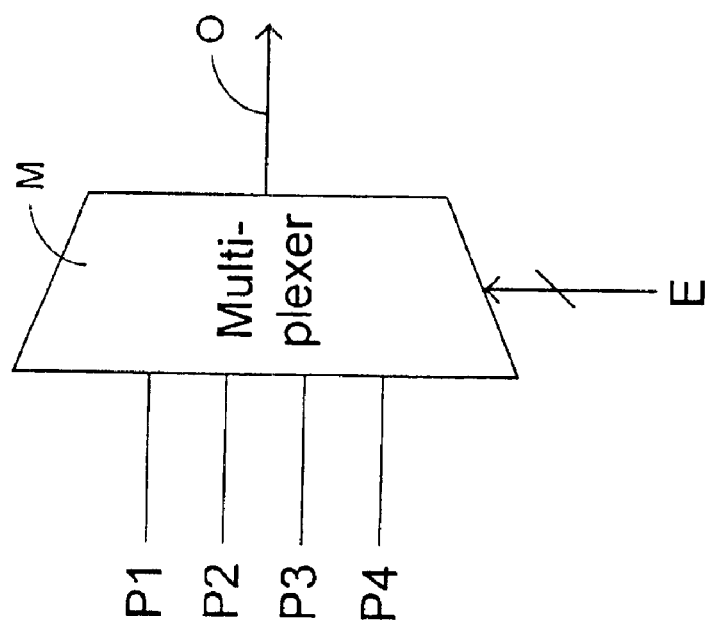
FIG. 1A is a schematic diagram showing a typical 4*1 multiplexer.
Figure 1B:
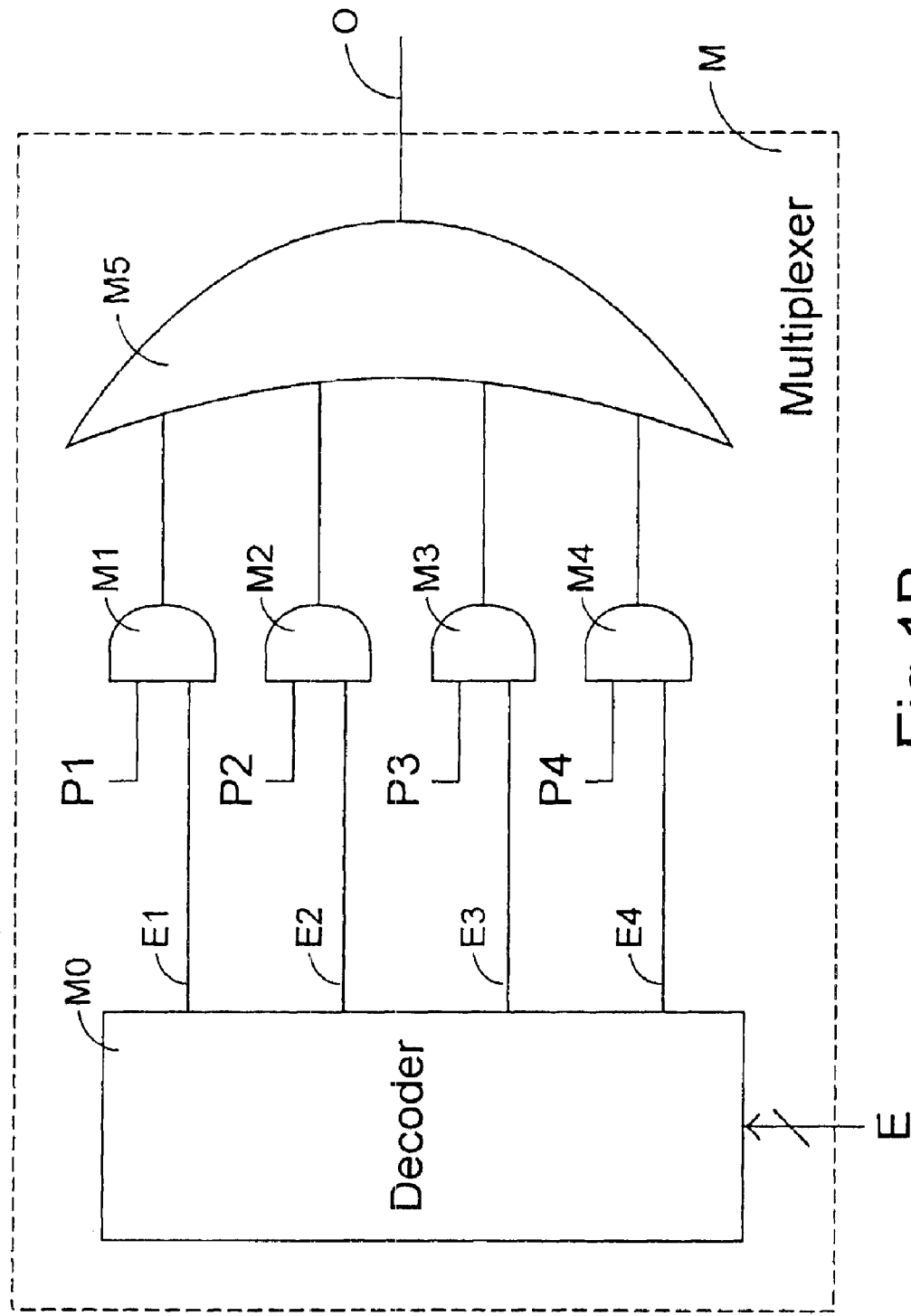
FIG. 1B is a schematic circuit diagram of the 4*1 multiplexer of FIG. 1A.
Figure 3:
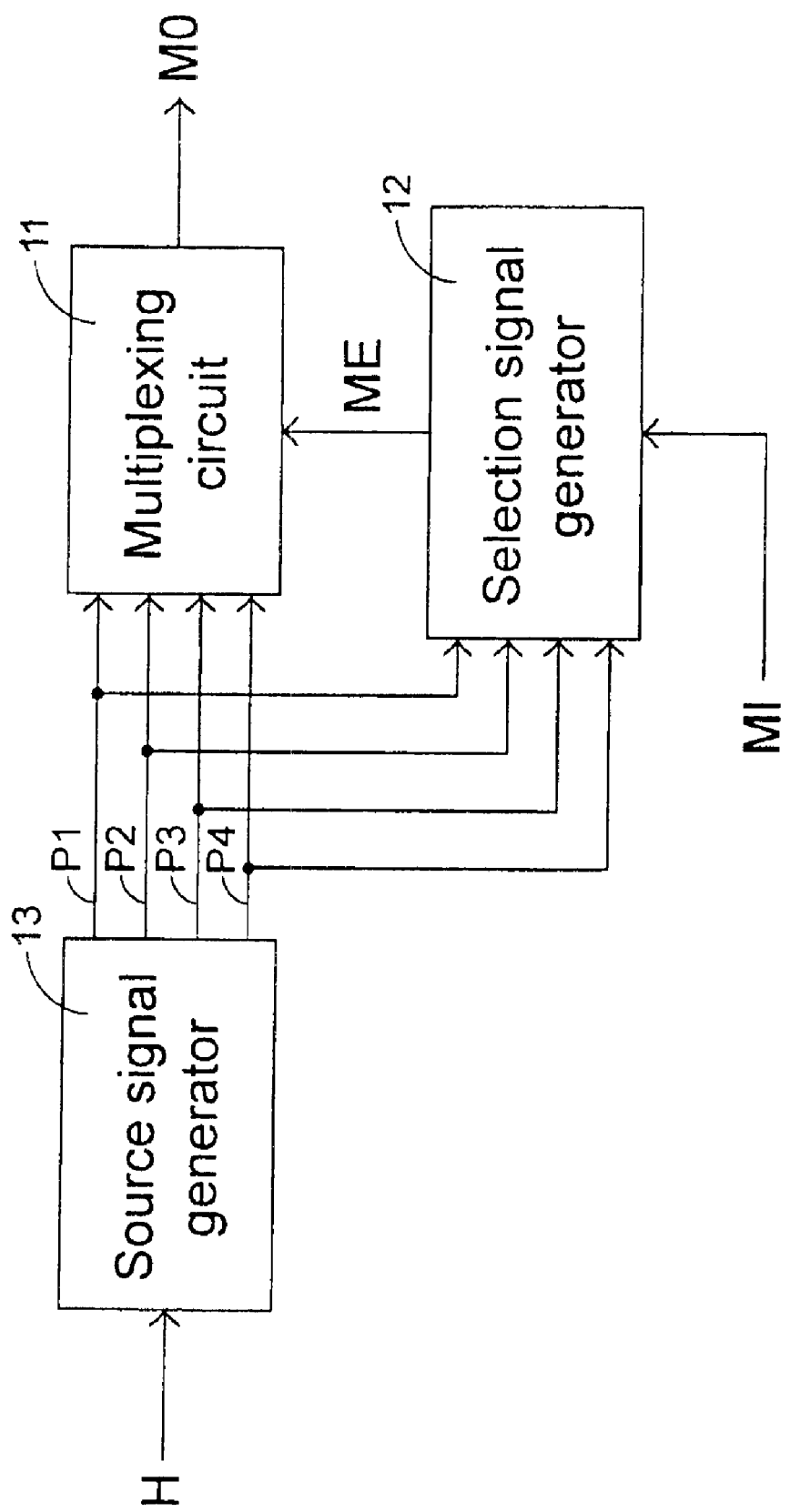
FIG. 3 is a block diagram schematically showing the generation and application of the selection signal according to the present invention.
Figure 4:
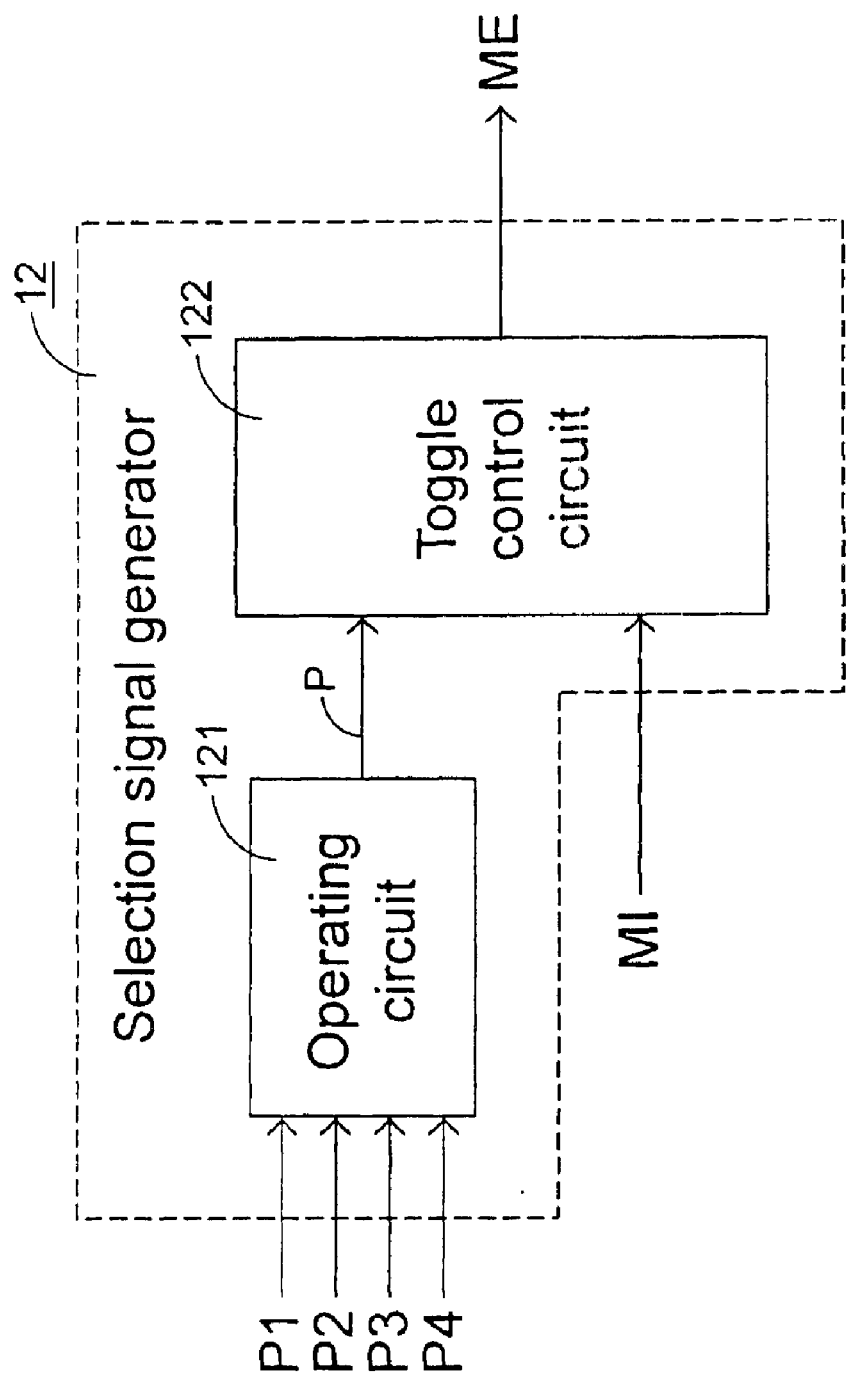
FIG. 4 is a block diagram schematically showing a selection signal generator according to the present invention.
Figure 5A:
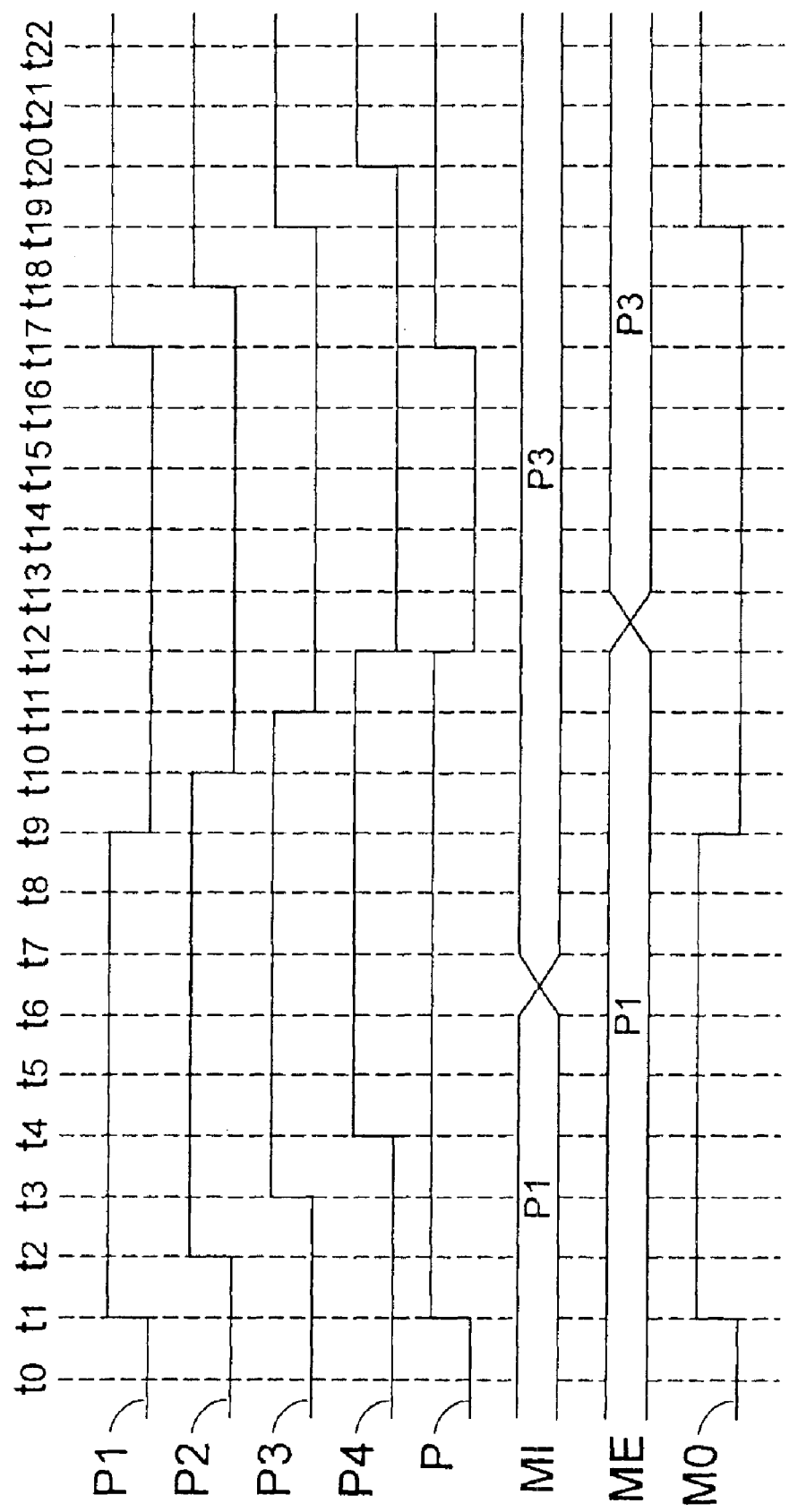
FIGS. 5A and 5B are waveform diagrams exemplifying the signals associated with the output signal of a multiplexer according to the present invention.
Figure 5B:
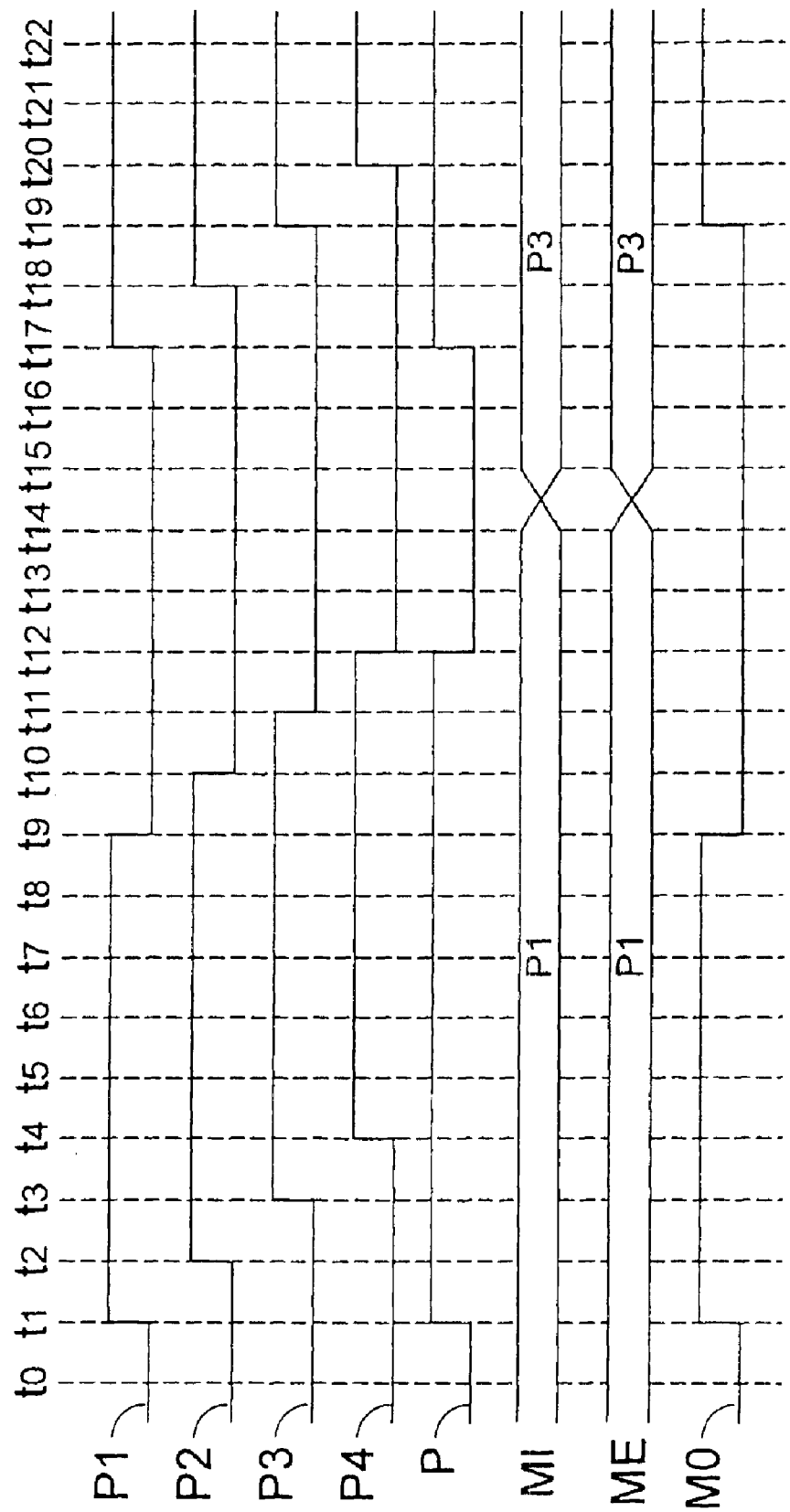

Please refer to FIG. 3. A selection signal ME is generated by a selection signal generator 12 to be provided for a multiplexing circuit 11 to generate an output signal MO from to a plurality of source signals, e.g. four source signals P1, P2, P3 and P4 as shown. The circuitry of the multiplexing circuit 11 has been exemplified with reference to FIG. 1A so as not to be described herein again. The plurality of source signals P1, P2, P3 and P4 are generated by a source-signal generator 13 in response to a high frequency signal H. The source-signal generator 13 is preferably a phase-locked loop (PLL) circuit so that every adjacent two of the source signals P1~P4 have one clock-unit difference therebetween, as shown in FIGS. 5A or 5B. The selection signal generator 12 will be described hereinafter with reference to FIG. 4.

Figure 2:
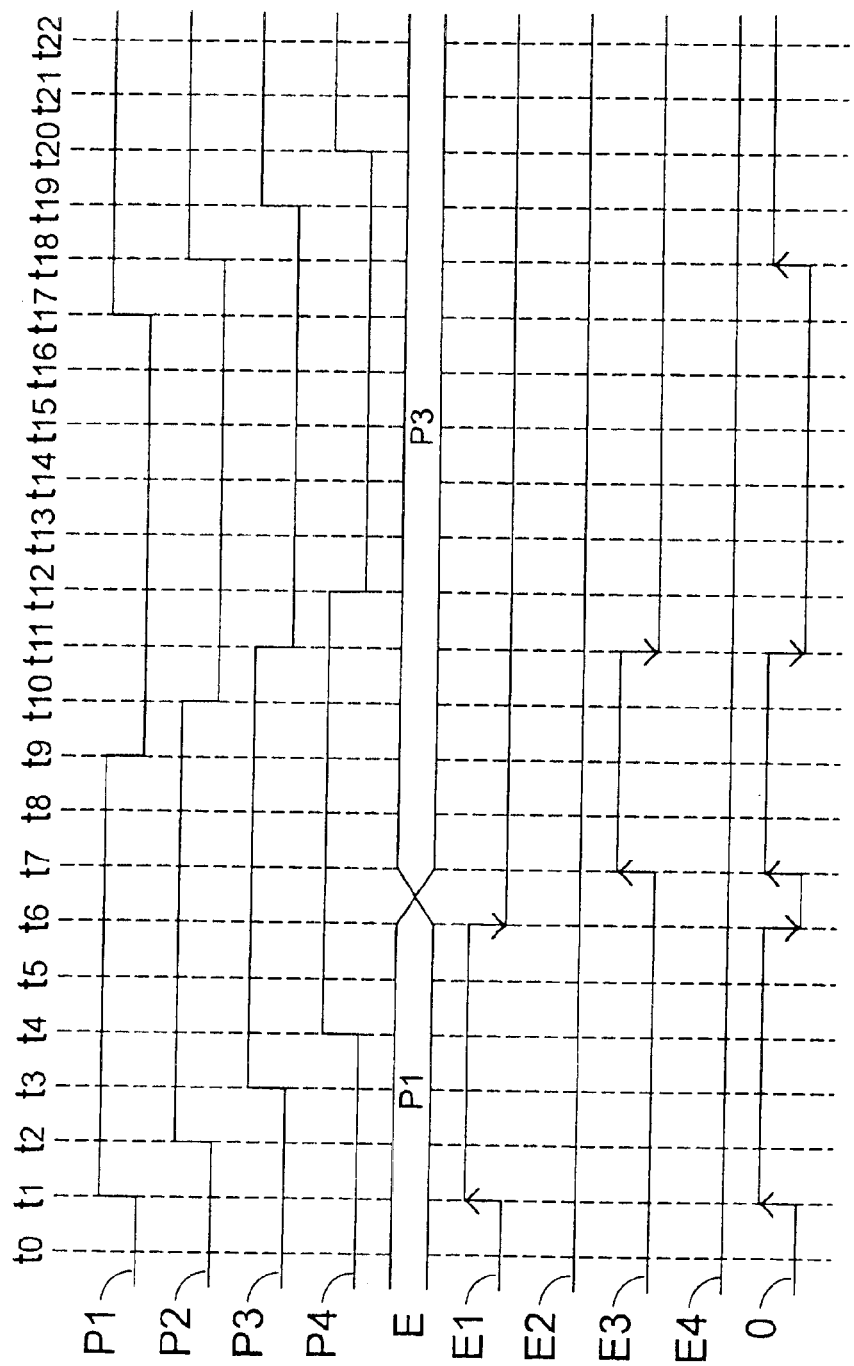
FIG. 2 is a waveform diagram showing the signals associated with the output signal of a multiplexer according to prior art.

In order to improve the accuracy of the selection signal to avoid the unexpected output signal as described above and as shown in FIG. 2, the present invention prohibits the selection signal from toggling when any of the source signals P1~P4 is at an output-enabled state, e.g. at a high-level state. Referring to FIG. 4, the above-mentioned purpose can be achieved by that selection signal generator 12. The selection signal generator 12 comprises an operational circuit 121 receiving and operating the source signals P1~P4 to obtain an operational output signal P, and a toggle control circuit 122 coupled to the operational circuit 121 and latching the operational output signal under a certain state condition in response to a selection command MI to obtain the selection signal ME. More specifically, the operational circuit 121 is an OR gate performing an OR operation of the source signals P1~P4 to obtain the operational output signal P. The toggle control circuit 122 can be an "active low" transparent latch. In other words, the toggle control circuit 122 latches the operational output signal P, and allows the selection command MI to be outputted as the selection signal ME only when the operational output signal P is at a low-level state.

Please refer to FIG. 5A again, in which an example of the selection signal generating method according to the present invention is show. In this example, the selection command MI toggles when all the source signals are not at low levels. First, the first source signal P1 is outputted. Afterwards, the selection command MI toggles at the time points t6 when the source signals P1~P4 are at a high level. Via the operation of the OR gate 121, a high-level operational output signal P is obtained due to the high level state of at least one source signal. In spite the selection command MI has toggled to ask for the output of the third source signal P3, the selection signal ME does not toggle immediately. It is because the "active low" transparent latch 122 does not allow the output of the selection command MI as the selection signal ME on the condition that the operational output signal P is at a high-level state. In stead, the transparent latch 122 allows the selection command MI to be outputted as the selection signal ME at the time point t12 when the source signals all become low level and the operational output signal P toggles to low.

Another example will be described herein with reference to the waveforms of FIG. 5B. In this example, the selection command MI toggles when all the source signals are at low levels. First, the first source signal P1 is outputted. Afterwards, the selection command MI toggles at the time point t14 when the source signals P1~P4 are all at a high level. Via the operation of the OR gate 121, a low-level operational output signal P is obtained due to the low level state of all the source signals. When the selection command MI has toggled to ask for the output of the third source signal P3, the selection signal ME toggles accordingly. It is because the "active low" transparent latch 122 now allows the output of the selection command MI as the selection signal ME on the condition that the operational output signal P is at a low-level state.

By this way, no unexpected waveform or improperly toggling of the output signal MO will appear no matter if the selection command MI toggles before or after all the source signals become low levels. The effect of the present invention is especially prominent under a high frequency operating circumstance.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method for improving accuracy of a selection signal provided for a multiplexing circuit, said multiplexing circuit generating an output signal from a plurality of source signals in response to said selection signal, and said method comprising a step of prohibiting said selection signal from toggling when any of said plurality of source signals is at an output-enabled state.

2. The method according to claim 1 wherein said output-enabled state is a high-level state.

3. The method according to claim 1 wherein every adjacent two of said source signals have one-clock difference therebetween, and said plurality of source signals are a series of increasingly lagging signals.

4. The method according to claim 1 wherein every adjacent two of said source signals have one-clock difference therebetween, and said plurality of source signals are a series of increasingly leading signals.

5. The method according to claim 1 wherein said plurality of source signals are generated by a phase-locked loop (PLL) circuit in response to a high frequency signal.

6. A method for generating a selection signal provided for a multiplexing circuit, said multiplexing circuit generating an output signal from a plurality of source signals in response to said selection signal, and said method comprising steps of:

performing an OR operation of said plurality of source signals to obtain an operational output signal; and latching said operational output signal in an active low manner in response to a selection command to obtain said selection signal.

7. The method according to claim 6 wherein every adjacent two of said source signals have one-clock difference therebetween, and said plurality of source signals are a series of increasingly lagging signals.

8. The method according to claim 6 wherein every adjacent two of said source signals have one-clock difference therebetween, and said plurality of source signals are a series of increasingly leading signals.

9. The method according to claim 6 wherein said plurality of source signals are generated by a phase-locked loop (PLL) circuit in response to a high frequency signal.

10. A device for generating a selection signal provided for a multiplexing circuit, said multiplexing circuit generating an output signal from a plurality of source signals in response to said selection signal, and said device comprising:

an operational circuit receiving and operating said plurality of source signals to obtain an operational output signal; and a toggle control circuit coupled to said operational circuit and latching said operational output signal under a certain state condition in response to a selection command to obtain said selection signal.

11. The device according to claim 10 wherein said operational circuit is an OR gate.

12. The device according to claim 10 wherein said toggle control circuit is a transparent latch.

13. The device according to claim 10 wherein said certain state condition is an active low condition.

* * * * *